(12) United States Patent
Dick

(10) Patent No.: US 8,848,842 B2
(45) Date of Patent: Sep. 30, 2014

(54) RECURSION UNIT SCHEDULING

(75) Inventor: Christopher H. Dick, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 118 days.

(21) Appl. No.: 13/587,794

(22) Filed: Aug. 16, 2012

(65) Prior Publication Data
US 2014/0050286 A1 Feb. 20, 2014

(51) Int. Cl.
*H04L 27/06* (2006.01)
*H03D 1/00* (2006.01)

(52) U.S. Cl.
USPC ........... 375/341; 375/262; 375/316; 375/324; 714/794

(58) Field of Classification Search
USPC ........... 375/341, 262, 316, 324; 714/704, 794
See application file for complete search history.

(56) References Cited

U.S. PATENT DOCUMENTS

| | | | |
|---|---|---|---|
| 8,064,548 B2 | 11/2011 | Sundberg et al. | |
| 8,145,877 B2 | 3/2012 | Jones et al. | |
| 8,219,782 B2 | 7/2012 | Stirling et al. | |
| 8,428,173 B2 | 4/2013 | Lin et al. | |
| 8,719,658 B2 * | 5/2014 | Cui et al. | 714/763 |
| 2003/0076890 A1 | 4/2003 | Hochwald et al. | |
| 2005/0138520 A1 | 6/2005 | Richardson | |
| 2008/0279298 A1 | 11/2008 | Ben-Yishai et al. | |
| 2010/0014606 A1 | 1/2010 | Chen et al. | |
| 2011/0320902 A1 * | 12/2011 | Gunnam | 714/752 |
| 2012/0204081 A1 | 8/2012 | Fresia et al. | |
| 2013/0151911 A1 * | 6/2013 | Dick et al. | 714/704 |

FOREIGN PATENT DOCUMENTS

EP 1 906 610 A1 4/2008
WO WO 2005/064800 A1 7/2005

OTHER PUBLICATIONS

U.S. Appl. No. 13/170,004, filed Jun. 27, 2011, Wu et al.
Amiri, Kiarash et al., "Flex-Sphere: An FPGA Configurable Sort-Free Sphere Detector for Multi-user MIMO Wireless Systems," *Proc. of the SDR '08 Technical Conference and Product Exposition*, Oct. 26, 2008, pp. 1-7, available from the Wireless Innovation Forum at www.wirelessinnovation.org.
Barbero, Luis G. et al., "A Fixed-Complexity MIMO Detector Based on the Complex Sphere Decoder," *Proc. of the IEEE $7^{th}$ Workshop on Signal Processing Advances in Wireless Communications*, Jul. 2, 2006, pp. 1-5, IEEE, Piscataway, New Jersey, USA.
Berrou, Claude et al., "Near Shannon Limit Error—Correcting Coding and Decoding: Turbo-Codes (1)," *Proc. of the IEEE International Conference on Communications*, May 23, 1993, pp. 1064-1070, vol. 2, Issue 1, IEEE, Piscataway, New Jersey, USA.
Bhargave, Ashish et al., "A New MIMO Detector for Iterative Decoding with Multiple Antenna Systems," *Proc. of the 2005 Military Communications Conference*, Oct. 17, 2005, pp. 1-5, IEEE, Piscataway, New Jersey, USA.

(Continued)

*Primary Examiner* — Ted Wang
(74) *Attorney, Agent, or Firm* — W. Eric Webostad

(57) ABSTRACT

An embodiment of a decoder is disclosed. For this embodiment of the decoder, a first estimation unit and a second estimation unit are for iterative decoding. A scheduler is to receive a mode select signal to provide either an indication of first scheduling information or second scheduling information to the first estimation unit and the second estimation unit responsive to the mode select signal.

19 Claims, 4 Drawing Sheets

(56) References Cited

OTHER PUBLICATIONS

Burg, Andreas et al., "VLSI Implementation of MIMO Detection Using the Sphere Decoding Algorithm," *IEEE Journal of Solid-State Circuits*, Jul. 2005, pp. 1566-1577, IEEE, Piscataway, New Jersey, USA.

Burg, A. et al., "VLSI Implementation of the Sphere Decoding Algorithm," *Proc. of the 30th European Solid-State Circuits Conference*, Sep. 21, 2004, pp. 303-306, IEEE, Piscataway, New Jersey, USA.

Chan, Albert M. et al., "A New Reduced-Complexity Sphere Decoder for Multiple Antenna Systems" *Proc. of the 2002 IEEE International Conference on Communications*, Apr. 28, 2002, pp. 460-464, IEEE, Piscataway, New Jersey, USA.

Dai, Yongmei, "A Comparative Study of QRD-M Detection and Sphere Decoding for MIMO-OFDM Systems," *Proc. of the 2005 IEEE 16th International Symposium on Personal, Indoor and Mobile Radio Communications*, Sep. 11, 2005, pp. 186-190, IEEE, Piscataway, New Jersey, USA.

Dai, Yongmei et al., "Performance Comparison Between Coded V-Blast and GSTTC MIMO-OFDM Systems "*Proc. of the 2004 IEEE 15th International Symposium on Personal, Indoor and Mobile Radio Communications*, Sep. 5, 2004, pp. 2581-2585, vol. 4, IEEE, Piscataway, New Jersey, USA.

Gross, Warren J., "VLSI Architecture for the Forward-Backward Algorithm," Jan. 1999, pp. 1-91, available from the University of Toronto Research Repository at http://tspace.library.utoronto.ca.

Guo, Zhan et al., "A 53.3 Mb/s 4×4 16-QAM MIMO Decoder in 0.35-μm CMOS" *Proc. of the 2005 International Symposium on Circuits and Systems*, May 23, 2005, pp. 4947-4950, IEEE, Piscataway, New Jersey, USA.

Langton, Charan, *Turbo Coding and MAP Decoding*, Tutorial 24, Part 1, Jan. 1, 2006, available at http://www.complextoreal.com.

Langton, Charan, *Turbo decoding using the MAP Algorithm*, Tutorial 24, Part 2, Jan. 1, 2006, available at http://www.complextoreal.com.

Myllylä, Markus et al., "A List Sphere Detector Based on Dijkstra's Algorithm for MIMO-OFDM Systems," *Proc. of the 18th Annual IEEE International Symposium on Personal, Indoor and Mobile Radio Communications*, Sep. 3, 2007, pp. 1-5, IEEE, Piscataway, New Jersey, USA.

Noguera, Juanjo et al., "Wireless MIMO Sphere Detector Implemented in FPGA," *Xcell Journal*, Jan. 1, 2011, pp. 38-45, Issue 74, Xilinx, Inc., San Jose, California, USA.

Razavizadeh, S. Mohhamad et al., "A New Faster Sphere Decoder for MIMO Systems," *Proc. of the 3rd IEEE International Symposium on Signal Processing and Information Technology*, Dec. 14, 2003, pp. 86-89, IEEE, Piscataway, New Jersey, USA.

Ryan, William E., "A Turbo Code Tutorial," Jan. 1, 1997, pp. 1-9, available at http://www2.engr.arizona.edu/~ryan/.

Stojnic, M. et al., "A Branch and Bound Approach to Speed Up the Sphere Decoder," *Proc. of the 2005 IEEE International Conference on Acoustics, Speech, and Signal Processing*, Mar. 18, 2005, pp. iii-429 to iii-432, vol. 3, IEEE, Piscataway, New Jersey, USA.

Su, Karen et al., "A New Ordering for Efficient Sphere Decoding," *Proc. of the 2005 International Conference on Communications*, May 16, 2005, pp. 1906-1910, vol. 3, IEEE, Piscataway, New Jersey, USA.

vashe.org, *Turbo Code Primer,*, Jul. 4, 2005, pp. 1-14, available at http://vashe.org.

Widdup, Benjamin et al., "A Highly-Parallel VLSI Architecture for a List Sphere Detector," *Proc. of the 2004 IEEE Conference on Communications*, Jun. 20, 2004, pp. 2720-2725, vol. 5, IEEE, Piscataway, New Jersey, USA.

Yang, Chia-Hsiang et al., "A Flexible VLSI Architecture for Extracting Diversity and Spatial Multiplexing Gains in MIMO Channels," *Proc. of the 2008 IEEE International Conference on Communications*, May 19, 2008, pp. 725-731, IEEE, Piscataway, New Jersey, USA.

Ketonen, Johanna et al., "MIMO Detection in Single Carrier Systems," *Proc. of the 19th European Signal Processing Conference*, Aug. 29, 2011, pp. 654-658, European Association for Signal Processing (EURASIP).

Studer, Christoph et al., "Implementation Trade-offs of Soft-Input Soft-Output MAP Decoders for Convolutional Codes," Rice University Online Repository, Feb. 14, 2012, pp. 1-10, http://www.ece.rice.edu/~cs32/papers/12TCAS_bcjrtradeoffs.pdf.

Valenti, Matthew, *Turbo Codes and Iterative Processing*, Washington State University Online Repository, Nov. 30, 1998, pp. 1-18, http://www.csee.wvu.edu/~mvalenti/documents/NZWCS.PPT.

Boutillon, Emmanuel, "VLSI Architectures for the MAP Algorithm," *IEEE Transactions on Communications*, Feb. 2003, pp. 175-185, vol. 51, No. 2, IEEE, Piscataway, New Jersey, USA.

\* cited by examiner

# US 8,848,842 B2

RECURSION UNIT SCHEDULING

TECHNICAL FIELD

An embodiment relates to integrated circuit devices ("ICs"). More particularly, an embodiment relates to recursion unit scheduling for an IC.

BACKGROUND

ICs are used for decoding. Turbo decoders are one type of decoder that is implemented in ICs. However, such IC implemented Turbo decoders may have limited decoding versatility. Hence, it is desirable and useful to provide a more versatile Turbo decoder.

SUMMARY

One or more embodiments generally relate to recursion unit scheduling for an IC.

An embodiment relates generally to a method for a receiver. In such an embodiment, a mode of operation of a decoder is selected as between a first mode and a second mode. Recursion units of the decoder are scheduled responsive to selection of the mode of operation. The first mode and the second mode are respectively associated with a first type of initialization and a second type of initialization of the decoder. Responsive to selection of the first mode, the decoder is initialized with a first number of iterations of an inner decoding loop of the decoder for the first type of initialization. Responsive to selection of the second mode, the decoder is initialized with a second number of iterations of the inner decoding loop of the decoder for the second type of initialization. The first number of iterations is substantially less than the second number of iterations. Responsive to selection of the first mode, iterations of an outer decoding loop associated with the decoder are performed for the initializing of the decoder.

An embodiment relates generally to a decoder. In such an embodiment, a first estimation unit and a second estimation unit are for iterative decoding. A scheduler is to receive a mode select signal to provide either an indication of first scheduling information or second scheduling information to the first estimation unit and the second estimation unit responsive to the mode select signal.

An embodiment relates generally to a receiver. In such an embodiment, a detector is configured to provide first candidate likelihood information for a feed-forward path. A first subtractor is to receive the first candidate likelihood information to provide second candidate likelihood information. A de-interleaver is to receive the second candidate likelihood information to provide a de-interleaved version of the second candidate likelihood information as third candidate likelihood information. A decoder is to receive the third candidate likelihood information to decode encoded symbol vector information to provide decoded symbol vector likelihood information and to provide fourth candidate likelihood information for a feedback path. The decoder is to receive a mode select signal for selecting either a first mode or a second mode for initialization of the decoder. The first mode uses recursion units of the decoder for performing acquisition recursions for the initialization. The second mode is for using Next Iteration Initialization for the initialization. A second subtractor is to receive the fourth candidate likelihood information and the third candidate likelihood information to subtract the third candidate likelihood information from the forth candidate likelihood information to provide refinement information. The first subtractor is to receive the refinement information to subtract the refinement information from the first candidate likelihood information to provide the second candidate likelihood information. The detector is coupled to receive the refinement information to provide the first candidate likelihood information with enhanced accuracy.

BRIEF DESCRIPTION OF THE DRAWINGS

Accompanying drawings show exemplary embodiments in accordance with one or more aspects. However, the accompanying drawings should not be taken to limit the invention to the embodiments shown, but are for explanation and understanding only.

DETAILED DESCRIPTION

Figure 1:
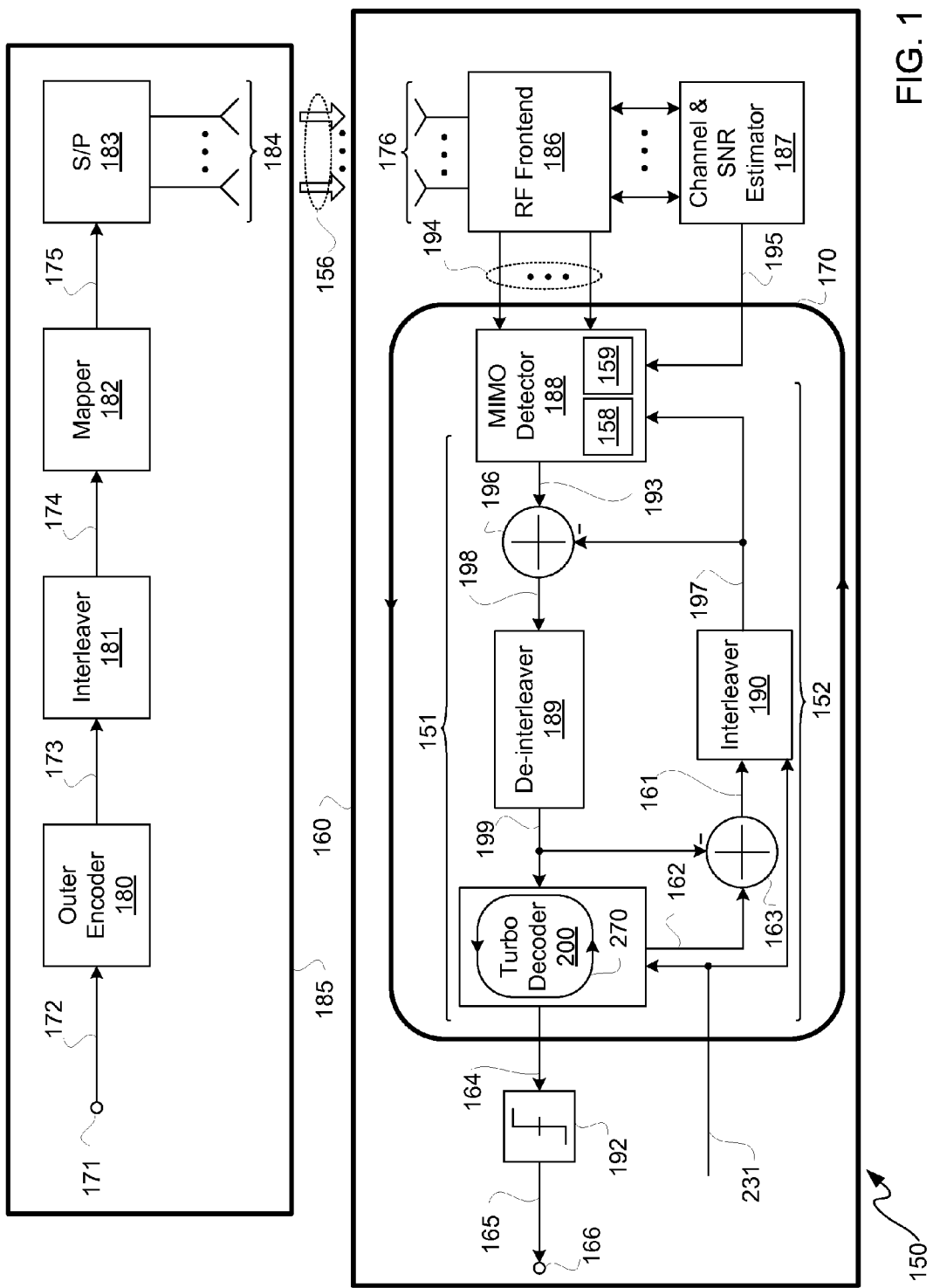
FIG. 1 is a block diagram depicting an exemplary embodiment of a communication system.

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Turbo encoding generally involves providing information data bits to at least two convolutional encoders. Even though the example of a rate ⅓ encoder is used, other rates may be used. Each convolutional encoder may use a recursive systematic convolutional code. Thus, for example, two recursive systematic coders ("RSCs") may be included in a Turbo encoder. Prior to being input to one of the two convolutional encoders, one stream of information data bits undergoes a permutation, such as a pseudo-random permutation. One type of permutation may be provided by using an interleaver; however, there are many types of permutations of sufficient pseudo-randomness or randomness that may be used. A Turbo encoder may provide three outputs, namely an unencoded information bitstream, a first encoded parity bitstream, and a second encoded parity bitstream. The first parity bitstream and the second parity bitstream may include a first encoded version and a second encoded version, respectively, of the unencoded information bitstream.

Bits may be mapped to symbols of a constellation, such as a type of quadrature amplitude modulation ("QAM") for example, for transmission. A transmitter with a Turbo encoder may provide three outputs that are mapped to symbols for transmission as symbol streams, namely an information data symbol stream, a first encoded parity symbol stream, and a second encoded parity symbol stream. Some noise may be introduced into these streams due to communication environment.

A maximum aposteriori probability ("MAP") process may be used for decoding by a decoder, such as a Turbo decoder. For example, in a Turbo decoder a pair of MAP estimation units may be coupled to cooperatively operate for refinement of an estimate of original information. Using MAP processing, such estimation units may output "soft decision information" obtained from parity bits, where such parity bits may be "noisy parity bits." A decoding process for each RSC may be represented using a trellis, where the number of states in such trellis at one point in time represents the number of states in an encoding state machine, and where a horizontal span of such trellis represents bits in a code block over time. For purposes of clarity by way of example not limitation, it shall be assumed that an input sequence to a decoder is obtained, where a symbol is obtained for each "clock tick." By "clock tick" it is generally meant a clock pulse or clock cycle. A number of L symbols may obtained for L ticks of a clock for forming a trellis. For a decoding process, likelihood of each state in a trellis may be determined at each defined location in time or trellis node.

As described below in additional detail, Turbo decoder versatility is improved by providing a bi-modal receiver, or more particularly a bi-modal Turbo decoder. Such bi-modal Turbo decoder is selectable between a first and a second mode. The first mode uses a first number of iterations for an inner decoding loop to initialize the Turbo decoder, and the second mode uses a second number of iterations for the inner decoding loop to initialize the Turbo decoder. The first number of iterations may be for backward recursion initialization, and the second number of iterations may be for Next Iteration Initialization ("NII"). The first number of iterations may be substantially less than the second number of iterations. Furthermore, the number of recursion units scheduled for initialization may be different as between these two modes.

FIG. 1 is a block diagram depicting an exemplary embodiment of a communication system 150. Communication system 150 includes a transmitter 185 and a receiver 160. Receiver 160 may be a Multiple-Input Multiple-Output ("MIMO") receiver for example. Transmit antennas 184 of transmitter 185 may be used to communicate transmission 156 to receive antennas 176 of receiver 160. In this exemplary embodiment, communication system 150 is a MIMO system. Thus, for purposes of clarity and not limitation it shall be assumed that input to receiver 160 is a MIMO input and that receiver 160 is a MIMO receiver. In other embodiments, a Single-Input Single-Output ("SISO") receiver may be used.

Generally, transmitter 185 includes an outer encoder, such as a Turbo encoder 180 for example, an interleaver 181, a mapper, such as a symbol mapper 182 for example, and a serial-to-parallel converter ("S/P") 183, as well as transmit antennas 184. Bit information 172 may be sourced from source 171 for input to Turbo encoder 180. Turbo encoder 180 may output multiple streams of information 173. Streams of information 173 may include an unencoded data bitstream, a first parity encoded bitstream, and a second parity encoded bitstream, as previously described herein. Again, a permutation of the unencoded data bitstream may be input to a convolutional encoder for producing the second encoded parity bitstream. Thus, for example, Turbo encoder 180 may include two convolutional encoders and a permutation block, such as an interleaver for example.

Interleaver 181 may be coupled to Turbo encoder 180 to receive streams of information 173 and may be configured to provide an interleaved version thereof, namely multiple streams of information 174. Streams of information 174 may be provided to symbol mapper 182. Symbol mapper 182 may provide multiple symbol streams 175 to S/P converter 183 for transmission 156 via transmit antennas 184.

Receiver performance, such as may be quantified in terms of bit error rate ("BER") and/or frame error rate ("FER"), may be improved by having a channel decoder, such as an iterative decoder. It may be further improved by an iterative decoder and a detector exchanging or sharing information. In this exemplary embodiment, a Turbo decoder 200 and a MIMO detector 188 are coupled for exchanging or sharing information. A configuration generally referred to as a Turbo equalizer includes a detector, such as MIMO detector 188 of receiver 160 for example, and an iterative decoder, such as Turbo decoder 200 for example, coupled for providing feedback from Turbo decoder 200 to MIMO detector 188. Feedback information, namely reliability information about each individual bit, may be used to refine information detected associated with that bit as fed forward from MIMO detector 188 to Turbo decoder 200.

In another embodiment, a Turbo decoder 200 and a SISO detector 188 may be coupled for exchanging or sharing information. Turbo decoder 200 is an example of an iterative decoder, as described below in additional detail. In another embodiment, iterative decoder 200 may be a Soft Output Viterbi Algorithm ("SOVA") decoder or other type of iterative decoder. However, for purposes of clarity and not limitation, it shall be assumed that a Turbo decoder 200 is used, even though in other embodiments another type of iterative decoder may be used.

Detector 188, whether a SISO or MIMO detector, effectively is presented with a received a waveform, whether representative of a SISO or MIMO waveform, for producing a "soft" output. For example, detector 188 may be a minimum mean squared error (MMSE) detector, a sphere detector, or other detector for generating bit-level reliability information for each bit in a received waveform.

Figure 2:
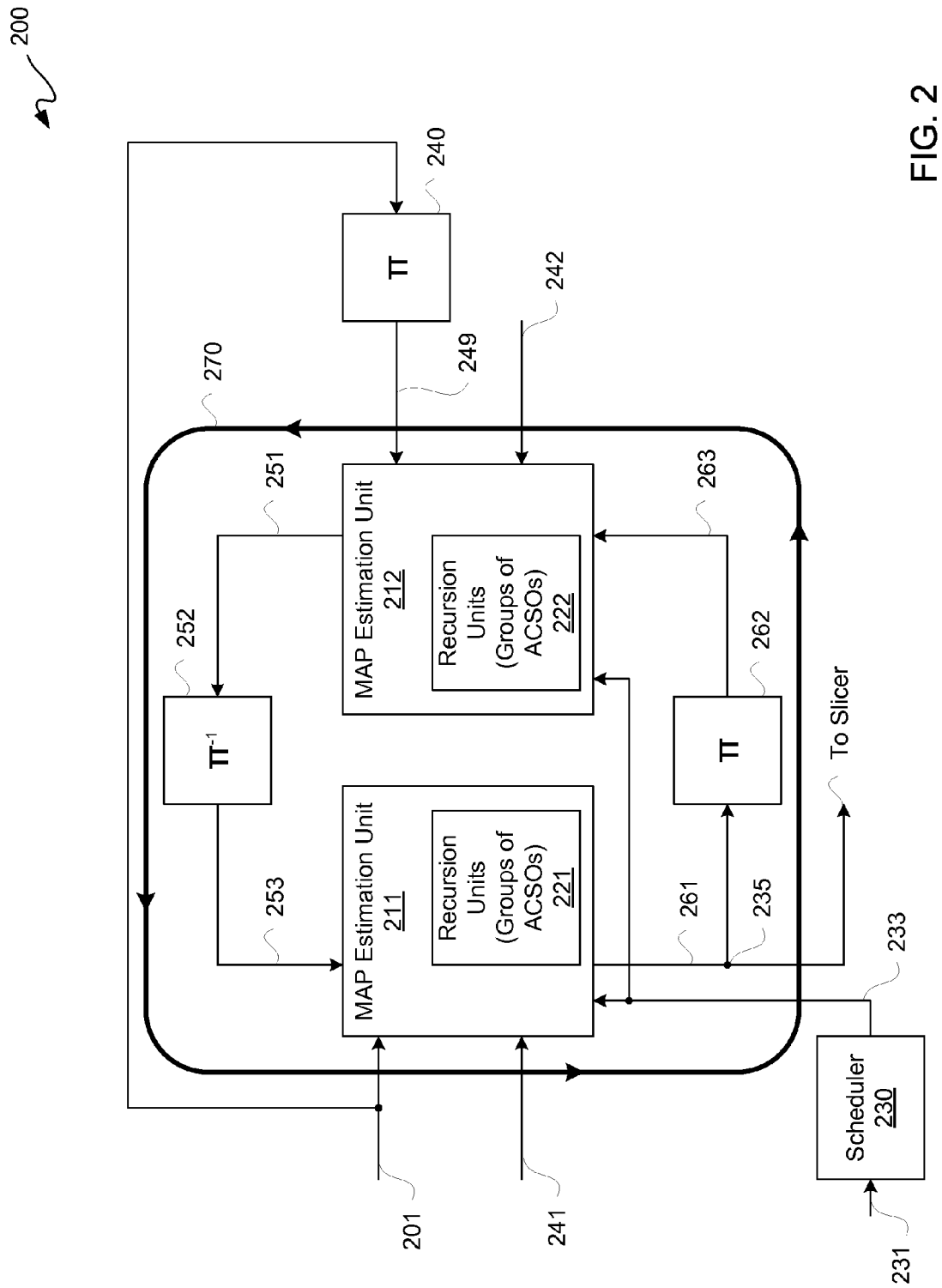
FIG. 2 is a block diagram depicting an exemplary embodiment of an iterative decoder.

Prior to further description of receiver 160, a more detailed description of an iterative decoder is provided with reference to FIG. 2. FIG. 2 is a block diagram depicting an exemplary embodiment of an iterative decoder, such as a Turbo decoder 200. Again, for purposes of clarity by way of example not limitation, Turbo decoder 200 for a MIMO receiver 160 of FIG. 1 is described; however, in other embodiments other types of iterative decoders may be used.

A decoding processing may involve forward and backward passes over a trellis. Generally, passes going from left-to-right over a trellis are referred to as "forward recursions," and passes going from right-to-left over such a trellis are referred to as "backward recursions." Both forward and backward recursions may use the same or similar forms of computations, which generally are log likelihood ratio ("LLR") computations. Furthermore, forward recursions, backward recursions, and LLR computations across the trellis may all be computed using Add-Compare-Select-with-Offset units ("ACSOs"). An ACSO, which may include adders, memory, and a multiplexer, is not described in unnecessary detail for purposes of clarity.

Such a decoding process may involve computation of extrinsic information or reliability information in a first MAP decoder unit, such as MAP estimation unit 211, passing such computed reliability information to a second MAP decoder unit, such as MAP estimation unit 212, after interleaving, which second MAP decoder unit then uses this computed and interleaved information to compute its own version of reliability information or extrinsic information. This processing by a first MAP decoder unit, interleaving, and processing such processed and interleaved information by a second MAP decoder unit constitutes one iteration in an iterative decoder, such as Turbo decoder 200 for example.

For purposes of clarity by way of example and not limitation, suppose that a trellis is 6000 symbols long, an optimum decoding may involve buffering all 6000 symbols for forward and backward recursions. This would introduce a significant amount of buffer overhead, as well as decoding latency. However, some applications cannot tolerate such buffer overhead or decoding latency, and accordingly, an approximation is used. This approximation may have to do with initialization states of a trellis, as described below in additional detail.

In one form of approximation, window segments of a trellis are used. To obtain initial state vectors for such window segments for recursions, dummy recursions are performed to obtain initial values for state vectors. This may be referred to as "acquisition processing." For example, dummy backward recursions ("dummy recursions") are used for obtaining approximations for initial values going from right-to-left across a trellis segmented by windows. ACSOs are resourced to provide for such dummy recursions.

In another form of approximation, initial states may be assumed for forward and backward recursions. While initial confidence values of a decoder may be off due to such assumption, such decoded confidence values converge with iterations around a decoding loop, namely become more accurate with subsequent iterations. This latter type of approximation is generally referred to as Next Iteration Initialization ("NII"). For example, initialization recursions may be eliminated altogether provided a sufficient number of iterations are performed, and backward recursions may assume an arbitrary initialization state vector, e.g., a probability of being in state 0 may be 1 and probability of being in all other states may be 0. Even a seemingly gross approximation as in this example may be used provided a sufficient number of decoding iterations are used. Generally, eight or more iterations are used in order to achieve sufficient accuracy, namely accuracy close to that obtained by using dummy recursions for initialization calculations.

As described below herein in additional detail, receiver 160 is a bi-modal receiver. In Turbo decoder 200, scheduling of recursion units, such as for example groupings of ACSOs, is responsive to a selected mode.

With continuing reference to FIG. 2, Turbo decoder 200 is coupled to or includes a scheduler 230. Scheduler 230 receives a mode select signal 231. Responsive to mode select signal 231, a control signal 233 is provided to MAP estimation units 211 and 212. MAP estimation units 211 and 212 may be thought of as respective decoders, but are referred to herein as estimation units so as to avoid confusion.

MAP estimation unit 211 includes recursion units 221. Recursion units 221 are groups of ACSOs. MAP estimation unit 212 includes recursion units 222. Recursion units 222 are groups of ACSOs. Responsive to mode select signal 231, scheduler 230 provides control signal 233 to indicate to each of MAP estimation units 211 and 212 whether recursion units respectively thereof obtained from recursion units 221 and 222 are to be used for dummy backward recursions. Effectively, control signal 233 provides recursion unit scheduling information to MAP estimation units 211 and 212.

A data stream 201, such as an unencoded symbol stream, is provided as an input to MAP estimation unit 211 and to interleaver 240. Data stream 201 is sometimes referred to as a "systematic" stream. Such data stream 201 may be obtained via a MIMO channel. A first parity stream 241, such as an encoded symbol parity stream, is provided as an input to MAP estimation unit 211. A second parity stream 242, such as another encoded symbol parity stream, is provided as an input to MAP estimation unit 212.

More particularly, soft decisions or log-likelihood ratios ("LLRs") of a payload or data stream ("soft decisions") 201 are provided as an input to MAP estimation unit 211 and to interleaver 240. Such soft decisions 201 may be obtained by processing output of MIMO detector 188. A first parity stream 241, such as LLRs of first parity bits from a first constituent encoder, is obtained from output of MIMO detector 188 by demultiplexing from a data stream and is provided as an input to MAP estimation unit 211. A second parity stream 242, such as soft decisions or LLRs of second parity bits from a second constituent encoder, is obtained from output of MIMO detector 188 by demultiplexing from such a data stream and is provided as an input to MAP estimation unit 212. Demultiplexing circuitry for providing a first parity stream 241 and a second parity stream 242 is not shown for purposes of clarity Each of MAP estimation units 211 and 212 has access to a coded version of data stream 201 via first parity stream 241 and second parity stream 242, respectively. First parity stream 241 may be different than second parity stream 242 due to permutation during encoding, such as interleaving for example as previously described. In this example embodiment, it shall be assumed that second parity stream 242 is permutated as part of its encoding. Furthermore, for this example embodiment, it shall be assumed that such permutation is an interleaving. However, other types of pseudo random or random permutations may be used.

An interleaved version of data stream 201 is output from interleaver 240 as interleaved data stream 249, and interleaved data stream 249 is provided as an input to MAP estimation unit 212. More particularly, an interleaved version of soft decisions or LLRs 201 is output from interleaver 240 as interleaved LLRs values 249, and interleaved LLR values 249 are provided as an input to MAP estimation unit 212. MAP estimation unit 212 provides reliability information output, also known as reliability information or extrinsic information output 251, as an input to de-interleaver 252. A de-interleaved version of reliability information obtained via reliability information output 251, namely reliability information output 253, is provided as an input to MAP estimation unit 211.

MAP estimation unit 211 provides reliability information output 261 as an input to interleaver 262. An interleaved version of reliability information obtained via reliability information output 261, namely reliability information output 263, is provided as an input to MAP estimation unit 212. Output of Turbo decoder 200 may be sourced from output node 235, namely may be reliability information output 261, which may be provided to a slicer, such as data slicer 192 of FIG. 1 to generate hard decisions for bits. In another embodiment, output of Turbo decoder 200 may be sourced as reliability information output 251 for input to a data slicer.

Complete decoding of a received code block proceeds in an iterative manner around inner decoding loop 270 of Turbo decoder 200. For example, MAP estimation unit 212 produces a reliability estimate or a confidence estimate for MAP estimation unit 211 for an iteration, and on a subsequent iteration, MAP estimation unit 211 produces another reliability estimate using the prior reliability estimate obtained from MAP estimation unit 212. Likewise, for example, MAP estimation unit 211 produces a reliability estimate or a confidence estimate for MAP estimation unit 212 for an iteration, and on a subsequent iteration, MAP estimation unit 212 produces another reliability estimate using an immediately prior reliability estimate obtained from MAP estimation unit 211. This process of successive refinements effectively provides decoding with error correcting capability.

Generally, a reliability estimate of a parity bit that has a relatively large positive number is more likely to represent a 1, and a reliability estimate of a parity bit that has a relatively large negative number is more likely to represent a −1. For sequence of k bits for k an positive integer, a corresponding sequence of k numbers of reliability or confidence estimates respectively for each bit may be output from Turbo decoder 200, such as output 164 of Turbo decoder 200 FIG. 1.

Returning to FIG. 1, receiver 160 includes receive antennas 176, and an RF frontend 186, channel and signal-to-noise ratio ("SNR") estimator 187, MIMO detector 188, summer 196, de-interleaver 189, Turbo decoder 200, data slicer 192, summer 163, and interleaver 190. A summer with a minus port may alternatively be referred to as a "subtractor." RF frontend 186 downconverts a received signal to a baseband frequency. Within RF frontend 186, Additive White Gaussian Noise ("AWGN") may be added to a received signal as described below in additional detail.

MIMO detector 188 may include a sphere detector 159. A more detailed description of a sphere detector that may be included in MIMO detector 188, is described in additional detail in co-pending patent application entitled "Detector for a Multiple-Antenna Receiver" by Michael Wu et al., assigned application Ser. No. 13/170,004, filed Jun. 27, 2011, which is incorporated by reference herein in its entirety for all purposes. In other words, MIMO detector 188 may be this type of sphere detector. However, another type of sphere detector or another type of channel detector may be used in other embodiments.

Even though the description herein is in terms of Turbo coding, including encoding and/or decoding, other types of coding, such as low density parity check ("LDPC") coding, may be used. Turbo codes are used for channel coding in cellular wireless communication systems. Turbo codes are used in 3G WCDMA networks, Long Term Evolution ("LTE") networks, LTE-Advanced networks, military links networks, and/or WiMAX networks. However, it should be appreciated that the embodiments described herein are not limited to current data rates associated with these types of networks, but may be used in data rates from 100 megabits per second ("Mbps") to gigabit per second ("Gbps") data rates.

Receiver 160 includes a feed-forward path 151 and a feedback path 152. A network associated with the feed-forward path 151 may be used without a network associated with feedback path 152. This may be thought of as a feed-forward-only decoding mode, such as feed-forward Turbo decoding. As previously described, both feed-forward path 151 and feedback path 152 networks may be used in combination in what may be thought of as an iterative receiver mode, such as for example Turbo equalization.

It should be appreciated that multiple iterations with reference to decoding via loop 270, namely an "inner loop" or "inner decoding loop," and multiple iterations with reference to a loop formed of feed-forward path 151 and feedback path 152 networks, namely an "outer loop" or "outer decoding loop" 170, both introduce decoding latency. In a mode associated with feed-forward-only decoding mode ("feed-forward mode"), iterations of such an inner decoding loop 270 may be used without using feedback path 152, and generally a sufficient number of such inner decoding loop iterations may be used to achieve improved error correction. This may be thought of as a sufficient number of such inner decoding loop iterations for NII to achieve sufficient convergence.

Thus for example for a feed-forward mode of Turbo decoding, ACSOs may not be used for dummy recursions, and all available ACSOs may be used to process a "real" data in contrast to "dummy" data. Thus, all such recursions performed may be "real data recursions," which may enhance throughput of Turbo decoder 200. A type of scheduling information provided in response a mode selected via mode select signal 231 may indicate that no subset of any of recursion units 221 and 222 need be reserved for use for dummy recursions. Accordingly, the availability of these ACSOs may be used to enhance throughput.

However, in a mode associated with equalization (a "feedback mode"), iterations of an inner decoding loop 270 are used in combination with iterations of an outer decoding loop 170. For purposes of clarity and not limitation, outer decoding loop 170 may likewise be thought of as a Turbo equalizer or Turbo equalization loop 170. Because the inner decoding loop iterations may be leveraged off of the outer decoding loop iterations, the number of inner decoding loop iterations may effectively be reduced. For example, decoding latency associated with inner decoding loop iterations may be reduced in contrast to using NII, where significantly more inner decoding loop iterations are used to obtain sufficient accuracy. Dummy recursions may be performed in order to perform fewer inner decoding loop iterations than if NII were used. Taking advantage of the leverage provided by using an outer decoding loop 170, fewer iterations of an inner decoding loop may be performed by using dummy recursions.

Other scheduling information provided in response to another mode selected via mode select signal 231 may indicate that a subset of recursion units of each of recursion units 221 and 222 is to be reserved for dummy recursions. Such subset of recursion units may be used to participate in either dummy forward recursions or dummy backward recursions, where generally dummy backward recursions are used. For purposes of clarity, such dummy recursions are referred to as acquisition recursions so as to be clearly distinguished from forward and backward recursions that are not dummy recursions, but rather are used for decoding of real data.

Scheduling of recursion units may vary according to a selected mode in order to enhance decoding throughput and/or reduce decoding latency. Furthermore, such selected mode may be selected at runtime. Additionally, an operational mode may change from a first selected mode to a second selected mode during runtime.

Multiple inputs obtained from transmission 156 are received by receive antennas 176. Receive antennas 176 may be coupled to RF frontend 186. AWGN may be added to received signaling in RF frontend 186, where received signals are downconverted to a baseband frequency. After other frontend processing, such RF frontend 186 processed received signals are provided to channel and SNR estimators, such as of channel and SNR estimator 187. Single signals and/or circuit instances are illustratively depicted in some instances for purposes of clarity and not limitation to represent multiple instances thereof. These processed received signals are also provided as a symbol vector input to MIMO detector 188. MIMO detector 188 may be coupled to receive channel information output 195, such as a channel matrix for example, from channel and SNR estimator 187.

Assuming for purposes of clarity by way of example and not limitation that MIMO detector 188 includes a sphere detector 159 and a parallel-to-serial converter ("P/S") 158, a list of candidate likelihood information is provided to summer 196 along feed-forward path 151. As described below in additional detail, this soft information is forwarded for a soft-input channel decoder, namely Turbo decoder 200, which refines such bit-level reliability information. Output 198 of summer 196 is provided as an input to de-interleaver 189 of feed-forward path 151. Output 199 of de-interleaver 189 is provided as an input to both Turbo decoder 200 and a minus port of summer 163. Generally, a de-interleaved version of candidate likelihood information is provided as input to Turbo decoder 200. Using such de-interleaved version of candidate likelihood information, Turbo decoder 200 decodes encoded symbol vector information to provide decoded symbol vector likelihood information output 164. As described below in additional detail, Turbo decoder 200 returns such refined bit-level reliability information to MIMO detector 188, and MIMO detector 188 may then use such refined bit-level reliability information as a priori data to improve candidate likelihood information 193 output therefrom on a subsequent iteration. Such outer decoding loop iterations may be performed multiple times as part of a decoding sequence.

Mode select signal 231 is provided as a control signal input to both interleaver 190 and Turbo decoder 200. With respect to interleaver 190, mode select signal 231 may be used to activate or deactivate interleaver 190, the latter of which is to disable feedback path 152. Interleaver 190 may be deactivate when receiver 160 is operated in a feed-forward mode, such that feedback path 152 is not used. In such a feed-forward mode, Turbo decoder 200 may have recursion units scheduled only for real data processing, as previously described.

With respect to a feedback mode, mode select signal 231 may be used to activate interleaver 190. In such a feedback mode, feedback path 152 is used, such as previously described. In a feedback mode, mode select signal 231 may cause Turbo decoder 200 to schedule a subset of its recursion units for performing acquisition recursions, as previously described. Mode select signal 231 may be asserted or de-asserted just before runtime, namely just before receiver 160 is to start processing received transmission 156. Furthermore, mode select signal 231 may be asserted or de-asserted during runtime, for example during an idle time after a current received transmission 156 has been processed. For purposes of clarity and not limitation, it shall be assumed that mode select signal 231 is asserted for a feedback mode and de-asserted for a feed-forward mode.

Decoded symbol vector likelihood information output 164 is provided as an input to data slicer 192. Output 165 of data slicer 192 is decoded symbol vector information, which may be provided for symbol-to-data conversion as generally indicated by sink 166. Output 165 may be hard bit-level decisions responsive to soft output of Turbo decoder 200, namely decoded symbol vector likelihood information output 164.

A refined version of de-interleaved candidate likelihood information 199 is provided as output 162 from Turbo decoder 200. Output 162 is provided as input to summer 163. Output of summer 163 is effectively the difference or refinements 161 with respect to candidate likelihood information. Such refinements 161 may be provided to interleaver 190. An interleaved version of refinements 161 is provided as output 197 from interleaver 190. Output 197 is provided as an input to a minus port of summer 196 and as an input to MIMO detector 188. Interleaved refinements output 197 may be subtracted from candidate likelihood information 193 to provide candidate likelihood information 198. Furthermore, interleaved refinements 197 may be used by MIMO detector 188 as additional information for more accurately determining of and/or more rapidly converging to likelihood values for candidate likelihood information 193.

An initialization mode selected responsive to mode select signal 231, where an inner decoding loop 270 and an outer decoding loop 170 are used, may use acquisition recursions. Another initialization mode selected responsive to the mode select signal 231, where an inner decoding loop 270 is used and an outer decoding loop 170 is not used, may use NII.

Figure 3:
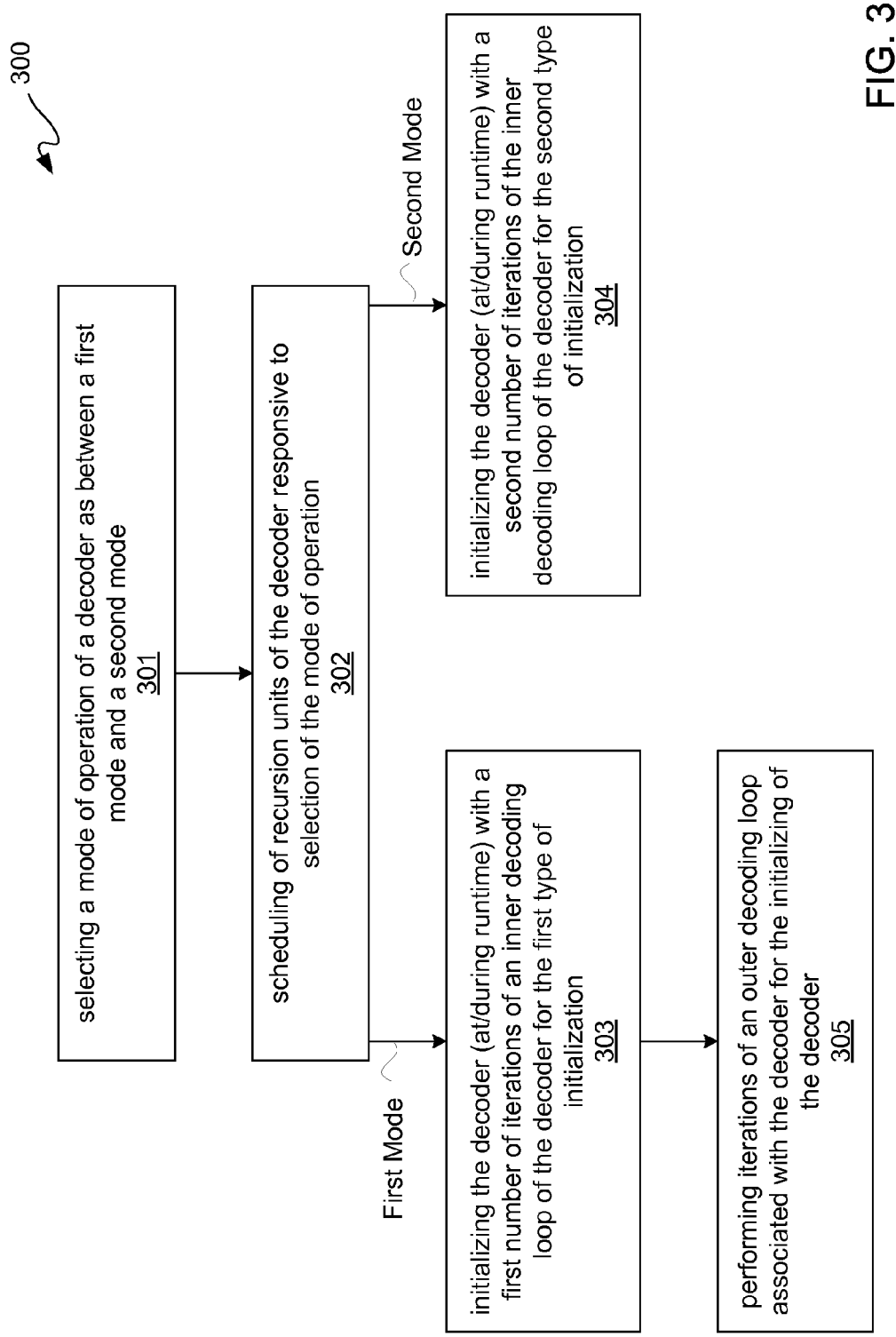
FIG. 3 is a flow diagram depicting an exemplary embodiment of a process for operating a receiver.

FIG. 3 is a flow diagram depicting an exemplary embodiment of a process for operating a receiver, namely receiver process flow 300. At 301, a mode of operation of a decoder is selected. Such selection is between a first mode and a second mode, where the first mode and the second mode are respectively associated with a first type of initialization and a second type of initialization of the decoder.

At 302, recursion units of the decoder are scheduled responsive to the mode of operation selected at 301. In this embodiment, the first mode uses recursion units of a decoder, such as Turbo decoder 200, for forward recursions and backward recursions for decoding real data and uses a portion of such recursion units for acquisition recursions for performing the first type of initialization. This is to be contrasted with the second type of initialization, for example NII, where there are no acquisition recursions, and thus all recursion units are available for forward recursions and backward recursions for decoding real data. In other words, no recursion units are used for acquisition recursions for the second type of initialization.

If the first mode is selected, then at 303 the decoder is initialized with a first number of iterations of an inner decoding loop of the decoder for the first type of initialization. This was previously described, for example as iterations of inner decoding loop 270 for acquisition processing initialization. If, however, the second mode is selected, then at 304 the decoder is initialized with a second number of iterations of the inner decoding loop of the decoder for the second type of initialization. This was previously described, for example as iterations of inner decoding loop 270 for NII.

The first number iterations is substantially less than the second number of iterations. This means that iterations associated with inner decoding loop 270 have more impact on initialization latency using NII in contrast to using acquisition processing initialization. However, iterations of outer decoding loop 170 contribute to initialization latency when using acquisition processing initialization.

For the first type of initialization responsive to selection of the first mode, at 305 iterations of an outer decoding loop are performed in association with the decoder for the initialization thereof. This was previously described, for example as iterations of outer decoding loop 170 for acquisition processing initialization. An example of acquisition processing initialization is backward recursion initialization.

Initial initialization of a decoder, such as Turbo decoder 200 for example, may be performed after or during runtime as previously described and as indicated for operations at 303 and 304. Thus, for example, scheduling of recursion units for either the first type of initialization or the second type of initialization may for example be performed at runtime for the first mode or the second mode, respectively. The scheduling of recursion units for the second type of initialization effectively means that no recursion units are scheduled for acquisition recursions. The scheduling of recursion units for the second type of initialization effectively means that a subset of the recursion units available for real data processing for decoding are reserved for acquisition processing.

Turbo decoder 200 of FIGS. 1 and 2 may be implemented in an ASIC, an ASSP, or as an accelerator in a multicore system-on-chip ("SoC") or multichip module ("MCM"). A multicore may include an array of general-purpose processors or special-purpose processors, where digital signal processors ("DSPs") may be included. Optionally, Turbo decoder 200 may be implemented in a programmable logic device ("PLD") as a hard macro block or a soft core instantiated in programmable resources.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 4:
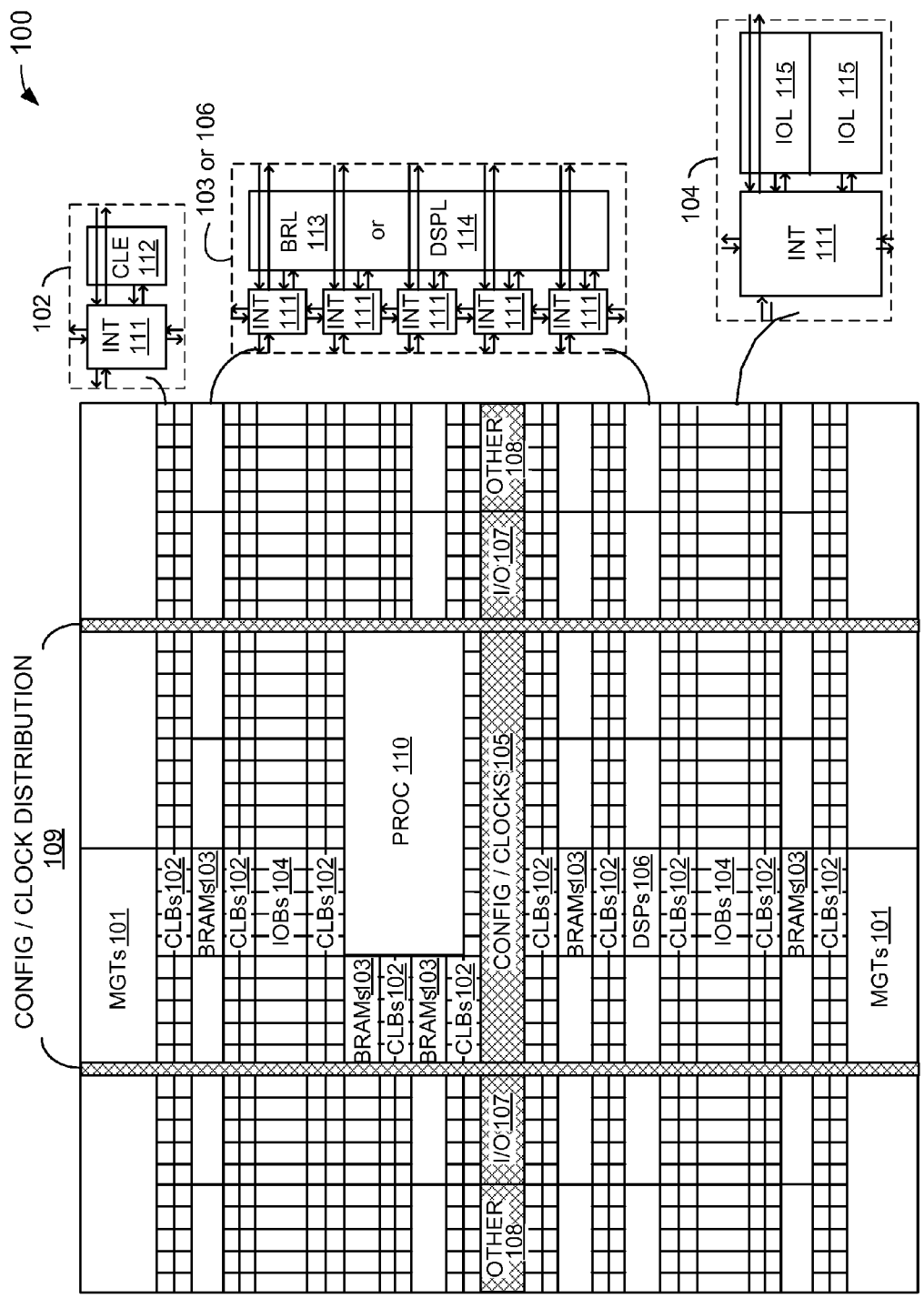
FIG. 4 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 4 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 4.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 4) is used for configuration, clock, and other control logic. Vertical columns 109 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 4 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 4 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. Claims listing steps do not imply any order of the steps. Trademarks are the property of their respective owners.

What is claimed is:

1. A method for a receiver, comprising:
 selecting a mode of operation of a decoder as between a first mode and a second mode;
 scheduling recursion units of the decoder responsive to selection of the mode of operation;
 wherein the first mode and the second mode are respectively associated with a first type of initialization and a second type of initialization of the decoder;

responsive to selection of the first mode, initializing the decoder with a first number of iterations of an inner decoding loop of the decoder for the first type of initialization; and responsive to selection of the second mode, initializing the decoder with a second number of iterations of the inner decoding loop of the decoder for the second type of initialization;

wherein the first number of iterations is substantially less than the second number of iterations; and responsive to selection of the first mode, performing iterations of an outer decoding loop associated with the decoder for the initializing of the decoder.

2. The method according to claim 1, wherein responsive to the scheduling:

the first mode uses the recursion units for forward recursions and backward recursions for decoding with a portion of the recursions units being used for acquisition recursions for the first type of initialization; and the second mode uses the recursion units for the forward recursions and the backward recursions for the decoding but does not use any of the recursion units for the acquisition recursions for the second type of initialization.

3. The method according to claim 1, wherein:
the first type of initialization is backward recursion initialization; and
the second type of initialization is Next Iteration Initialization.

4. The method according to claim 1, wherein the scheduling of the recursion units for the first mode or the second mode is at or during runtime.

5. The method according to claim 1, wherein:
the first mode includes using a feed-forward path network from a detector to the decoder and a feedback path network from the decoder to the detector; and
the second mode includes using the feed-forward path network from the detector to the decoded but does not include using the feedback path network from the decoder to the detector.

6. The method according to claim 1, wherein:
the first mode is a Turbo equalizing mode; and
the second mode is a Turbo decoding mode.

7. A decoder, comprising:
a first estimation unit and a second estimation unit for iterative decoding; and
a scheduler to receive a mode select signal to provide either an indication of first scheduling information or second scheduling information to the first estimation unit and the second estimation unit responsive to the mode select signal;
wherein a subset of recursion units of each of the first estimation unit and the second estimation unit are used for initialization responsive to the first scheduling information and are not used for the initialization responsive to the second scheduling information.

8. The decoder according to claim 7, further comprising:
a first interleaver to receive first reliability information from the first estimation unit;
the second estimation unit to receive output of the first interleaver;
a second interleaver and the first estimation unit to receive an uncoded stream;
the second estimation unit to receive output of the second interleaver;
a first de-interleaver to receive second reliability information from the second estimation unit;

the first estimation unit to receive output of the first de-interleaver;
the first estimation unit to receive a first parity stream; and
the second estimation unit to receive a second parity stream.

9. The decoder according to claim 8, wherein:
the first parity stream includes a first encoded version of the uncoded stream; and
the second parity stream includes a second encoded version of the uncoded stream.

10. A receiver system including the decoder of claim 9, the receiver system comprising:
a data slicer to receive either the first reliability information or the second reliability information to provide hard bit-level decisions;
a detector to receive a symbol vector and a channel matrix to provide candidate likelihood information;
a first summer to receive the candidate likelihood information;
a second de-interleaver to receive output of the first summer;
the decoder to receive output of the second de-interleaver;
a second summer to receive either the first reliability information or the second reliability information from the decoder;
a minus port of the second summer to receive the output of the second de-interleaver;
a third interleaver to receive output of the second summer; and
a minus port of the first summer and the detector both to receive output from the third interleaver.

11. The system according to claim 10, wherein:
the first summer is for subtracting the output of the third interleaver from the candidate likelihood information; and
the second summer is for subtracting the output of the second de-interleaver from either the first reliability information or the second reliability information.

12. The system according to claim 11, wherein the decoder is for decoding Turbo encoded information.

13. The system according to claim 11, wherein the decoder is for decoding Low Density Parity Check ("LDPC") encoded information.

14. The system according to claim 11, wherein the detector is a Multiple-Input Multiple-Output ("MIMO") detector.

15. The system according to claim 14, wherein the MIMO detector includes a sphere detector.

16. A receiver, comprising:
a detector configured to provide first candidate likelihood information for a feed-forward path;
a first subtractor to receive the first candidate likelihood information to provide second candidate likelihood information;
a de-interleaver to receive the second candidate likelihood information to provide a de-interleaved version of the second candidate likelihood information as third candidate likelihood information;
a decoder to receive the third candidate likelihood information to decode encoded symbol vector information to provide decoded symbol vector likelihood information and to provide fourth candidate likelihood information for a feedback path;
the decoder to receive a mode select signal for selecting either a first mode or a second mode for initialization of the decoder;
the first mode using recursion units of the decoder for performing acquisition recursions for the initialization;

the second mode for using Next Iteration Initialization for the initialization;

a second subtractor to receive the fourth candidate likelihood information and the third candidate likelihood information to subtract the third candidate likelihood information from the forth candidate likelihood information to provide refinement information;

the first subtractor to receive the refinement information to subtract the refinement information from the first candidate likelihood information to provide the second candidate likelihood information; and the detector coupled to receive the refinement information to provide the first candidate likelihood information with enhanced accuracy.

17. The receiver according to claim 16, wherein:
the decoder is a Turbo decoder; and
the detector is a Multiple-Input Multiple-Output ("MIMO") sphere detector.

18. The receiver according to claim 16, wherein:
responsive to selection of the first mode, the feedback path is used for the initialization of the decoder; and
responsive to selection of the second mode, the feedback path is not used for the initialization of the decoder.

19. The receiver according to claim 16, wherein:
the initialization using the second mode does not use recursion units of the decoder; and
the initialization using the second mode uses substantially more iterations of the decoder than does the first mode to approach accuracy of the first mode.

* * * * *